United States Patent
Oda et al.

(10) Patent No.: US 11,046,616 B2
(45) Date of Patent: Jun. 29, 2021

(54) TUNGSTEN SILICIDE TARGET AND METHOD OF MANUFACTURING SAME

(71) Applicant: JX Nippon Mining & Metals Corporation, Tokyo (JP)

(72) Inventors: Kunihiro Oda, Ibaraki (JP); Takayuki Asano, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 16/493,006

(22) PCT Filed: Jan. 22, 2018

(86) PCT No.: PCT/JP2018/001779
§ 371 (c)(1),
(2) Date: Sep. 11, 2019

(87) PCT Pub. No.: WO2018/173450
PCT Pub. Date: Sep. 27, 2018

(65) Prior Publication Data
US 2020/0071232 A1    Mar. 5, 2020

(30) Foreign Application Priority Data
Mar. 24, 2017 (JP) .............................. JP2017-059965

(51) Int. Cl.
*C04B 35/58* (2006.01)
*C23C 14/34* (2006.01)
*C23C 14/06* (2006.01)

(52) U.S. Cl.
CPC .... *C04B 35/58092* (2013.01); *C23C 14/0682* (2013.01); *C23C 14/34* (2013.01)

(58) Field of Classification Search
CPC .................. C04B 35/58092; H01J 37/3491
See application file for complete search history.

(56) References Cited

U.S. PATENT DOCUMENTS

| | | | |
|---|---|---|---|
| 4,619,697 A | 10/1986 | Hijikata et al. | |
| 4,938,798 A | 7/1990 | Chiba et al. | |
| 5,294,321 A | 3/1994 | Satou et al. | |
| 5,409,517 A | 4/1995 | Satou et al. | |
| 5,415,829 A | 5/1995 | Ohhashi et al. | |
| 5,418,071 A * | 5/1995 | Satou ................ | C04B 35/58085 204/298.13 |
| 5,460,793 A * | 10/1995 | Kano ................ | C04B 35/58085 204/298.12 |
| 5,464,520 A * | 11/1995 | Kano .................. | C23C 14/0682 204/298.12 |
| 5,618,397 A * | 4/1997 | Kano ................ | C04B 35/58085 204/298.12 |
| 5,919,321 A * | 7/1999 | Hirakawa ........... | C23C 14/3414 148/423 |
| 6,309,593 B1 | 10/2001 | Sato et al. | |
| 2017/0009335 A1 | 1/2017 | Yamakoshi | |

FOREIGN PATENT DOCUMENTS

| | | |
|---|---|---|
| JP | 61-136964 A | 6/1986 |
| JP | 63-219580 A | 9/1988 |
| JP | 1-131073 A | 5/1989 |
| JP | 2-47261 A | 2/1990 |
| JP | 2-247379 A | 10/1990 |
| JP | 3-130360 A | 6/1991 |
| JP | 4-191366 A | 7/1992 |
| JP | 5-140739 A | 6/1993 |
| JP | 5-200367 A | 7/1994 |
| JP | 5-322529 A | 11/1994 |
| JP | 5-49068 A | 2/1996 |
| JP | 9-125237 A | 5/1997 |
| JP | 2896233 B2 | 5/1999 |
| JP | 2002-182365 A | 6/2002 |
| KR | 1994-0010456 B1 | 10/1994 |

OTHER PUBLICATIONS

International Search Report and Written Opinion dated Feb. 20, 2018 in corresponding PCT application No. PCT/JP2018/001779.
European communication dated Dec. 7, 2020 in corresponding European patent application No. 18770613.0.
International Preliminary Report on Patentability issued Oct. 3, 2019 in corresponding PCT application No. PCT/JP2018/001779.

* cited by examiner

*Primary Examiner* — Karl E Group
(74) *Attorney, Agent, or Firm* — Nields, Lemack & Frame, LLC

(57) ABSTRACT

A tungsten silicide target capable of suppressing the occurrence of particles during sputtering is provided by a method different from conventional methods. The tungsten silicide target includes not more than 5 low-density semi-sintered portions having a size of 50 μm or more per 80000 mm² on the sputtering surface.

5 Claims, No Drawings

TUNGSTEN SILICIDE TARGET AND METHOD OF MANUFACTURING SAME

TECHNICAL FIELD

The present invention relates to a tungsten silicide target that is used for formation of an electrode and wiring of a semiconductor device such as LSI, and a manufacturing method thereof.

BACKGROUND ART

In order to achieve in-plane homogenization of a metallic thin film obtained by deposition, homogenization of the internal structure of a sputtering target has been constantly enhanced, so that, in combination with improvement in the sputtering method itself, the marginal generation of physical vapor deposition (PVD) to be replaced with chemical vapor deposition (CVD) has been always prolonged. While there exists a system for consistent supply of a high-quality target material of pure metal or alloy to produce a homogenized film with low defects by an aggregated texture controlling method utilizing the metallic properties thereof, improvement is strictly required for some target materials having a composition of intermetallic compound made by powder metallurgy to be used in the same manner as the target of pure metal at the same defect level in some cases.

In particular for a metal silicide target, the compound thereof is inevitably used in a semiconductor circuit formed of metal and a silicon wafer. In a gate salicide etc., although a pure metal deposited on silicon is combined to obtain a silicide in many cases, tungsten silicide is a typical silicide material deposited by sputtering directly from a target material as a metal silicide, which has been used for a long period until today.

Naturally having hard and brittle properties as characteristics of metal silicide, tungsten silicide cannot be formed into a target shape by plastic deformation as in the case of pure metal, so that sinter molding by powder metallurgy is usually employed. Raw material silicide is supplied in a powder form, filled into a mold, and then compression molded by a press. In a hot-pressing method, which is a method of heating the powder to achieve enhancement of bonding between powder grains and densification, the press sintering needs to be performed in an inert gas or vacuum in order to increase the temperature of metal silicide to an effective sintering temperature. When densification of a target and particle reduction effect through oxygen lowering are aimed, vacuum hot pressing is preferred.

The internal texture state of a target is deeply related with the surface characteristics when it is exposed on the surface by sputtering. A coarse and-heterogeneous internal texture results in a rough surface morphology, which becomes an undesirable particle source caused by fine chipping at a stepped end as well as formation and peeling of a redeposited film. A fine homogeneous texture has been therefore required. Refining of raw material powder should be performed to obtain the fine homogeneous texture of a target material in powder metallurgy. However, the finer raw material powder results in an increase in the amount of adsorbed oxygen due to the increased surface area, leading to an increase in the oxygen content in a sintered material and to generation of internal oxides, which induces micro arcing during sputtering and can be a particle source. Thus, the fine pulverization and the oxygen lowering are always in a trade-off relation, so that methods for highly balancing both have been employed, including selection of pulverizing techniques, suppression of increase in oxygen, and addition of a deoxidizing process.

For example, in order to achieve refinement and densification of the texture of a metal silicide target, in Japanese Patent Laid-Open No. H2-47261 (Patent Literature 1), disclosed is a method of manufacturing a sputtering target including the steps of mixing a high-melting point metal powder and silicon powder, forming silicide through a silicide reaction in high vacuum, then pulverizing the silicide into a size of 150 μm or less, further adding and mixing a silicon powder thereto, and sintering the mixture with a hot isostatic press after vacuum degassing. In the publication, it is described that when the silicide reaction is performed at a temperature of 1200° C. or less, the oxygen content is as high as 500 ppm.

In Japanese Patent Laid-Open No. H2-247379 (Patent Literature 2), disclosed is a method of manufacturing a silicide target characterized by the steps of pulverizing and mixing a high-purity high-melting point metal powder and a high-purity silicon powder in vacuum or in an Ar atmosphere with a ball mill so as to be mechanically alloyed, then forming silicide through a silicide reaction in vacuum or in an Ar atmosphere, then pulverizing the silicide to be filled in a sealed can for consolidation, and sintering the silicide by a hot isostatic press. In Example in the publication, a molybdenum silicide target with an oxygen content of 235 ppm is disclosed.

In Japanese Patent Laid-Open No. H5-140739 (Patent Literature 3), disclosed is a method of manufacturing a silicide target characterized by the pressure sintering of a high-melting point metal silicide powder containing silicide grains and silicon grains, both of which have a grain size of less than 10 μm adjusted to MSix (M: high-melting point metal, x=2 to 3), at a sintering temperature of 1300 to 1360° C., under a pressure of 200 to 300 kgf/cm², for a retention time of 1 to 10 hours.

In Japanese Patent Laid-Open No. H8-49068 (Patent Literature 4), disclosed is a method of manufacturing a silicide target characterized by the steps of forming silicide through a silicide reaction between a tungsten powder and a silicon powder, which are mixed to have an atomic ratio between silicon and tungsten Si/W of more than 2, under a reducing atmosphere, and then pulverizing the silicide, sintering the pulverized powder at 1200° C. to 1400° C., under 110 MPa or more, such that the target having a relative density of 101% or more. The relative density is a ratio of the real density to the theoretical density calculated assuming the structure is composed of stoichiometric tungsten silicide WSi₂ and pure silicon Si. In Example in the publication, a molybdenum silicide target with an oxygen content of 240 to 275 ppm is disclosed.

In Japanese Patent Laid-Open No. H4-191366 (Patent Literature 5), disclosed is a method of manufacturing a silicide target characterized by the steps of mixing and sintering a high-melting point metal powder having a grain size of 200 μm or less and a Si powder having a grain size of 200 μm or less, then pulverizing the mixture into a raw material powder having a grain size of 500 μm or less, and compressing and sintering the powder at high temperature.

In Japanese Patent Laid-Open No. 2002-182365 (Patent Literature 6), disclosed is a method of manufacturing a sputtering target characterized by including a step of mixing a high-purity silicon powder having a maximum grain size of 32 μm or less and a high-melting point metal powder having a maximum grain size of 20 μm or less, a step of forming a metal silicide by filling a forming mold with the mixed powder and heating it at 1000° C. to 1300° C. in a vacuum of $10^{-2}$ to $10^{-3}$ Pa under a press pressure of 0.1 to 3 MPa to cause a reaction between the silicon and the high-melting point metal, and a step of sintering for densification in a vacuum of $10^{-2}$ to $10^{-3}$ Pa or in an inert gas atmosphere at $5.32 \times 10^4$ to $6.65 \times 10^4$ Pa, under a press pressure of 24.5 to 39.2 MPa at 1350° C. to 1450° C. In the Literature, it is also described that the oxygen content of a finally obtained target can be 500 ppm or less—by using a silicon powder having an oxygen content of about 300 ppm or less obtained by deoxidation in a high vacuum of $10^{-2}$ to $10^{-3}$ Pa at a temperature of 1000° C. to 1200° C. prior to mixing with the high-melting point metal.

CITATION LIST

Patent Literature

Patent Literature 1: Japanese Patent Laid-Open No. H2-47261
Patent Literature 2: Japanese Patent Laid-Open No. H2-247379
Patent Literature 3: Japanese Patent Laid-Open No. H5-140739
Patent Literature 4: Japanese Patent Laid-Open No. H8-49068
Patent Literature 5: Japanese Patent Laid-Open No. H4-191366
Patent Literature 6: Japanese Patent Laid-Open No. 2002-182365

SUMMARY OF INVENTION

Technical Problem

As described above, the conventional development of a tungsten silicide target material has been intended to form an electrode and wiring of a semiconductor device, so that achievement of compatibility between fine pulverization and oxygen lowering (high purification) has been focused. Development of a novel tungsten silicide target material free from conventional stereotypes, however, can probably be useful for expanding the room for development of a semiconductor device.

In an embodiment of the present invention, from the perspective described above, an object is to provide a tungsten silicide target capable of suppressing generation of particles during sputtering by a method different from the conventional methods. Further, in an embodiment of the present invention, another object is to provide a method of manufacturing such a tungsten silicide target.

Solution to Problem

A target such as a tungsten silicide target with a composition containing excess silicon relative to a desired metal disilicide ($WSi_2$) has a two-phase texture-including a metal disilicide and excess silicon. In order to reduce the oxygen content that increases in a fine pulverization step to obtain the uniform fine texture of both, a deoxidation step may be performed. In a target material with scattered sintered textures of metal disilicide in which traces of excess silicon which has been volatized and removed as silicon monoxide during the deoxidation step remain as voids in places, it has become evident that the void-containing parts act in the same manner as a low-density target material to generate fine particles due to advancement of a particle analysis method.

The deoxidation step utilizes the volatile properties of oxygen adsorbed on the surface of silicon that silicon monoxide in the gas state is more stable than silicon dioxide in the solid state under high vacuum at high temperature. Accordingly, the reduction in oxygen content involves the reduction in the silicon content. In a temperature range where silicon monoxide is stably formed and volatized, sintering of a part of the metal disilicide powder itself is initiated. After disappearance of the silicon that has been present in the internal part of a sintering region through volatilization with adsorbed oxygen as silicon monoxide, a sponge-like low-density semi-sintered portion of metal disilicide is formed and remains.

The raw material powder through the deoxidation step is in a semi-sintered state due to the high-temperature treatment. In order to fill a mold with the raw material for hot pressing, the raw material is required to be in a powder state again. On this occasion, fine pulverization, however, causes adsorption of oxygen on the surface again due to increase in the surface area, returning to the state prior to the step of deoxidation. Coarse pulverization is therefore employed. Handling as a semi-sintered cluster of fine texture can suppress the increase in oxygen to a minor extent.

The semi-sintered portion with low oxygen content of the metal disilicide lacking excess Si generated by the deoxidation maintains the low-density texture without deformation during hot-press sintering performed at a temperature equal to or below the melting point, so that it remains in the texture as a particle source. According to the study results by the present inventors, it has been found that the semi-sintered portion with low oxygen content can more easily be a particle source rather than oxygen. It has then been found that the occurrence of particles during sputtering can be significantly reduced by sufficiently reducing the low-density semi-sintered region to make a homogeneous fine texture even when having a high oxygen concentration. The present invention has been accomplished based on the findings.

In an embodiment of the tungsten silicide target according to the present invention, the tungsten silicide target has not more than 5 low-density semi-sintered portions having a size of 50 μm or more per 80000 $mm^2$ on a sputtering surface.

In another embodiment of the tungsten silicide target according to the present invention, the tungsten silicide target has an oxygen concentration of 500 ppm by mass to 2000 ppm by mass.

In another embodiment of the tungsten silicide target according to the present invention, the tungsten silicide target has a Si content in excess of a stoichiometric composition $WSi_2$.

In further another embodiment of the tungsten silicide target according to the present invention, the tungsten silicide target has a maximum grain size of 20 μm or less of Si grains on the sputtering surface observed.

In an embodiment of the method of manufacturing a tungsten silicide target according to the present invention, the method comprises:

obtaining a mixture of a $WSi_2$ powder having an oxygen concentration of 500 ppm by mass to 2000 ppm by mass and a maximum grain size of 20 μm or less and a Si powder having an oxygen concentration of 500 ppm by mass to 2000 ppm by mass and a maximum grain size of 20 μm or less; and sintering the mixture under pressure to obtain a sintered product.

In another embodiment of the method of manufacturing a tungsten silicide target according to the present invention, a method of manufacturing a tungsten silicide film comprising sputtering using the tungsten silicide target according to an embodiment of the present invention is provided.

Advantageous Effects of Invention

According to an embodiment of the present invention, a tungsten silicide target capable of suppressing the occurrence of particles during sputtering can be provided.

DESCRIPTION OF EMBODIMENTS

1. Tungsten Silicide Target

In an embodiment of the tungsten silicide target according to the present invention, the tungsten silicide target has an oxygen concentration of 500 ppm by mass to 2000 ppm by mass. Since conventional tungsten silicide targets have an oxygen concentration of 200 to 300 ppm by mass as described in the prior patent literature, it can be said that the oxygen concentration specified in this present embodiment of the present invention is considerably high. In the tungsten silicide target according to the present embodiment, extreme reduction in the oxygen concentration is not required, so that the generation of semi-sintered portions with low oxygen content as a side effect of reduction in oxygen concentration can be significantly suppressed. The oxygen concentration in a tungsten silicide target is usually higher than 500 ppm by mass, which is an inevitable oxygen concentration in general when a raw material powder having a maximum grain size of 20 μm or less is obtained through sufficient refinement by jet milling pulverization or the like. Therefore, the oxygen concentration can be used as an index for achievement of sufficiently fine pulverization. From this perspective, the oxygen concentration is preferably 500 ppm by mass or more, more preferably 800 ppm by mass or more, indicating the further achievement of refinement. Further, from the perspective of preventing excessive formation of oxides which are presumed to be a cause of micro arcing to generate particles, the oxygen concentration in a tungsten silicide target is preferably 2000 ppm by mass or less, more preferably 1500 ppm by mass or less, still more preferably 1200 ppm by mass or less. Incidentally, in the present invention, the oxygen concentration in a tungsten silicide target can be measured by inert gas fusion-infrared absorption spectrometry.

By maintaining fine constituent grains obtained through fine pulverization until completion of sintering of a target material, generation of particles during sputtering can be significantly suppressed even in the case of a tungsten silicide target having a high oxygen concentration. Since excessive reduction in oxygen concentration is not required by the deoxidation step, the formation of semi-sintered portion with low oxygen content can be suppressed. The semi-sintered portion with low oxygen content refers to a sponge-like tungsten silicide after silicon present in the internal part of the sintered region disappeared by volatilization with adsorbed oxygen as silicon monoxide.

In general, a synthesized tungsten silicide material in which silicon is excessively introduced is mainly composed of two types of grains, i.e., tungsten disilicide formed of 1 atom of tungsten combined with two atoms of silicon and redundant silicon remaining without reacting with tungsten. In description of the density, density can be relatively easily determined by Archimedes method or the like. However, since what is important in dealing with particle suppression issue is how dense the material texture can be, so that relative density % to the theoretical density is usually used.

For example, as the theoretical density of tungsten disilicide is 9.75 g/cm$^3$, a measured density of a sintered product obtained of 9.70 g/cm$^3$ results in 9.70/9.75=99.49%. The result value, which is 100% or less, means that voids are present in the internal part of the sintered product. However, calculation of 100% theoretical density of a composite component material as in the present invention is difficult, and the calculated value of the relative density exceeds 100% in some cases. Since the relative density of a target material including many of the semi-sintered clusters described above frequently reaches 102%, it cannot be said that there exist no voids and thorough measures has been taken against particle-related problems even if the relative density calculated from measured density is 100%.

In the present embodiment, densification of a target material is, therefore, discussed based on the number density of low-density semi-sintered portions instead of the relative density. In an embodiment of the tungsten silicide target according to the present invention, the tungsten silicide target may have not more than 5, preferably not more than 3, more preferably not more than 2, still more preferably not more than 1, most preferably 0, low-density semi-sintered portions having a size of 50 μm or more on a sputtering surface per 80,000 mm$^2$.

In the present invention, the number of the low-density semi-sintered portions having a size of 50 μm or more on the sputtering surface is measured as follows. The sputtering surface is ground to a surface roughness Ra<1 μm (in accordance with JIS B0601: 2013), and then wet polished to a surface roughness Ra<0.5 μm (in accordance with JIS B0601: 2013) with abrasive grains in the range from #240 to #2000 (in accordance with JIS R6001-2: 2017). The sputtering surface is then exposed to visible light with a commonly used spotlighting device such as a desktop fluorescent lamp. When the light reflected from the sputtering surface in this state is visually observed, the low-density semi-sintered portions are observed as bright spots different from the mother phase (note, however, that the spots look dark when reflectivity is high, and the light source and the eye is misaligned from the incident/reflection straight line). While the size of the bright spot that can be visually identified is experientially about 20 μm, the size of the bright spot is defined to be a diameter of a minimum circle that can enclose the bright spot as measurement object on a microscopic image of the measured point.

In an embodiment of the tungsten silicide target according to the present invention, the concentration of impurities in total other than oxygen is 0.1 mass % or less, preferably 0.01 mass % or less, more preferably 0.001 mass % or less. Tungsten and silicon as raw materials having a purity of 5 to 9 N are easily commercially available. By using such high-purity raw materials, the concentration of impurities in total other than oxygen in a tungsten silicide target manufactured is easily achievable to 0.001 mass % or less. Here, in the present invention, the concentration of impurities other than oxygen is measured by GDMS method, and the elements to be measured include Fe, Al, Ni, Cu, Cr, Co, K, Na, U, and Th.

In an embodiment of the tungsten silicide target of the present invention, the tungsten silicide target has a Si content in excess of the stoichiometric composition WSi$_2$. With an atomic ratio of silicon to tungsten of Si/W≥2, an advantage is obtained that film stress can be relaxed to enhance the adhesion of the sputtered film to a substrate.

From this perspective, the atomic ratio of silicon to tungsten (Si/W) is preferably 2.1 or more, more preferably 2.3 or more. Further, from the perspective of keeping the sheet resistance of a sputtered film low, Si/W is preferably 4 or less, more preferably 3 or less, still more preferably 2.8 or less.

In an embodiment of the tungsten silicide target according to the present invention, the maximum grain size of Si grains is 20 μm or less when the sputtering surface is observed. Although the occupation percentage of Si grains on the sputtering surface is lower than that of $WSi_2$ grains, the small grain size of Si grains contributes to the homogenization of the texture of a target. The maximum grain size of the Si grains is preferably 15 μm or less, more preferably 10 μm or less, still more preferably 5 μm or less, and may be, for example, 0.5 to 20 μm.

In the present invention, when the sputtering surface is observed, the maximum grain size of Si grains is measured by the following method. A tungsten silicide target as measurement object is divided by cutting or the like to prepare an observation sample having a size of 10 to 20 mm². The sputtering surface remaining in the sample prepared is polished by wet buffing with abrasive grains of alumina or silica, so that the grain boundaries can be easily observed. Subsequently, the surface corresponding to the sputtering surface is observed with a metallurgical microscope to identify a Si grain having a largest grain size, the grain size of which is recorded as measured value. The grain size of each Si grain is defined as the diameter of the smallest circle that can enclose the Si grain in an observation field. The tungsten silicide target according to the present invention has a texture with high uniformity because of the powder method, so that the measured value in one visual field can be regarded as a representative value.

The tungsten silicide target according to the present invention may be processed into a shape such as a disc shape, a rectangular plate shape, or a cylindrical shape for use, though not limited thereto.

In an embodiment, the tungsten silicide target according to the present invention may be bonded to a backing plate for use. The target and the backing plate may be bonded by any known method, using, for example, a low-melting point solder such as indium solder, tin solder and tin alloy solder. Also, any known material may be used as the material of a backing plate, including, for example, copper (e.g. oxygen-free copper), copper alloy, aluminum alloy, titanium, and stainless steel.

In an embodiment, the tungsten silicide target according to the present invention may be used as a sputtering target for forming an electrode, wiring and a contact barrier of a semiconductor device such as LSI, though not limited thereto. The tungsten silicide target according to the present invention may be used in any sputtering apparatus without any specific limitation. For example, a magnetron sputtering apparatus and an RF applying magnetron DC sputtering apparatus may be used.

2. Method of Manufacturing Target

The method of manufacturing a tungsten silicide target according to the present embodiment is exemplified as follows. In an embodiment of the method of manufacturing a tungsten silicide target according to the present invention, the method comprises:

obtaining a mixture of a $WSi_2$ powder having an oxygen concentration of 500 ppm by mass to 2000 ppm by mass and a maximum grain size of 20 μm or less and a Si powder having an oxygen concentration of 500 ppm by mass to 2000 ppm by mass and a maximum grain size of 20 μm or less, and sintering the mixture in a vacuum or inert gas under pressure to obtain a sintered product.

Examples of the method of sintering under pressure include vacuum pressing, hot pressing, and hot isostatic pressing (HIP), and it is preferable that vacuum hot pressing be selected to prevent remaining gas in voids from interfering with sintering.

The $WSi_2$ powder can be manufactured by mixing a W powder and a Si powder at a stoichiometric ratio (W:Si=1:2) and causing a silicide reaction in a synthesis furnace. The W powder and the Si powder are commercially available, and, for example, products having a purity of 99.9 mass % or more, preferably a purity of 99.99 mass % or more, more preferably a purity of 99.999 mass % or more, may be used. A commercially available high-purity $WSi_2$ powder having a purity of 99.9 mass % or more, preferably a purity of 99.99 mass % or more, more preferably a purity of 99.999 mass % or more, may be used without the synthesis.

The size of the $WSi_2$ powder and the Si powder reflects the size of the $WSi_2$ grains and the Si grains in the target, affecting refinement of the texture. The maximum grain size of both the $WSi_2$ powder and the Si powder is, therefore, preferably 20 μm or less, more preferably 16 μm or less, still more preferably 12 μm or less, and may be, for example, 0.1 to 20 μm. Adjustment of the maximum grain size of the $WSi_2$ powder may be performed by, for example, pulverizing the $WSi_2$ powder with a pulverizer such as a ball mill, an attritor, and a jet mill, and then sifting the powder with a sieve having a desired opening or removing outsized coarse grains with a classifier such as a jet mill. Also, adjustment of the maximum grain size of the Si powder may be performed in the same manner by pulverization, sifting and classification. It is preferable that the pulverization be performed under an inert gas atmosphere such as argon, so that unnecessary oxidation can be suppressed.

It is desirable that the oxygen concentration in the $WSi_2$ powder and the Si powder be adjusted to 500 ppm by mass to 2000 ppm by mass, preferably 800 ppm by mass to 1500 ppm by mass, more preferably 800 ppm by mass to 1200 ppm by mass prior to sintering, so that the oxygen concentration in the target to be obtained after sintering is easily controlled in a required range.

Also, in a situation such as where the oxygen concentration of the $WSi_2$ powder and the Si powder is too high prior to pulverization, the step of pulverizing the $WSi_2$ powder and the Si powder may be performed after deoxidization by vacuum heating the $WSi_2$ powder and the Si powder individually or in a mixed state.

The mixture of the $WSi_2$ powder and the Si powder may be obtained by preparing the $WSi_2$ powder and the Si powder, respectively, and mixing both of them, or the mixture powder of $WSi_2$ grains and Si grains may be directly obtained by mixing the W powder and the Si powder under conditions with excess Si (Si/W≥2) to cause a silicide reaction in synthesis of $WSi_2$ powder.

When different types of powder such as the $WSi_2$ powder and the Si powder are mixed, it is preferable that an apparatus capable of uniform mixing such as a V-type mixer, a pot mill and a ball mill be used.

After the mixture of the $WSi_2$ powder and the Si powder having a predetermined concentration and a predetermined maximum grain size is obtained, the mixture is fired with hot pressing to obtain a sintered product. It is preferable that the hot pressing be performed under conditions allowing the sintered product to achieve high densification and high strength. Hot pressing can be performed, for example, under the following conditions.

Pressing temperature: 1250 to 1400° C., preferably 1300 to 1390° C.

Atmosphere (degree of vacuum): $1\times10^{-1}$ Pa or less, preferably $1\times10^{-2}$ Pa or less Pressing pressure: 15 to 50 MPa, preferably 25 to 50 MPa Pressing time: 60 to 180 minutes, preferably 120 to 180 minutes Retention time: 120 to 240 minutes, preferably 120 to 180 minutes Here, the retention time is a period during which the pressing temperature is maintained after the predetermined pressing temperature is reached.

After hot pressing, the pressed product is processed into a required shape by machining, so that a sputtering target is obtained.

EXAMPLES

Examples and Comparative Examples of the present invention are shown as follows. These Examples are provided for better understanding of the present invention and the advantages thereof, and not intended to limit the invention. In the following description, the oxygen concentration measurement was performed by an oxygen analyzer (apparatus name: TC600) manufactured by LECO Corporation, which employs inert gas fusion-infrared absorption spectrometry, in every case.

Example 1

A commercially available W powder having an oxygen concentration of 500 ppm by mass and an impurity concentration in total other than oxygen of 5 ppm by mass and a Si powder having an oxygen concentration of 2000 ppm by mass and an impurity concentration in total other than oxygen of 5 ppm by mass obtained by pulverizing commercially available Si lumps were mixed with a V-type mixer at an atomic ratio of W:Si=1:2 and synthesis of tungsten silicide ($WSi_2$) was performed in a synthesis furnace. The reaction was performed under synthesis conditions at 1330° C. for 4 hours after vacuum-evacuated to $4\times10^{-2}$ Pa. After completion of the reaction, the product was allowed to cool to 50° C. and then taken out from the furnace. The product was pulverized with a ball mill under an argon atmosphere and sifted with a dry sieve with an opening of 20 μm (mesh No. 635), so that a $WSi_2$ fine powder having a maximum grain size of 20 μm was obtained. The oxygen concentration of the $WSi_2$ powder obtained was 500 ppm by mass.

On the other hand, commercially available Si lumps were pulverized with a ball mill under an argon atmosphere and sifted with a dry sieve with an opening of 20 μm (mesh No. 635), so that a Si fine powder having a maximum grain size of 20 μm was obtained. The oxygen concentration of the Si fine powder obtained was 2000 ppm by mass.

The $WSi_2$ fine powder and the Si fine powder were mixed with a V-type mixer to have an atomic ratio of W:Si=1:2.7, so that a raw material mixed powder was obtained. A carbon die was charged with the raw material mixture to be subjected to hot pressing. The conditions for hot pressing were as follows.

Conditions for Hot Pressing

Pressing temperature: 1350° C.
Atmosphere: vacuum of $1\times10^{-1}$ Pa or less
Pressing pressure: 30 MPa
Pressing time: 60 minutes to 180 minutes after reaching maximum temperature
Retention time: 180 minutes Here, the retention time is a period during which the pressing temperature is maintained after the predetermined pressing temperature is reached.

After hot pressing, the pressed product was taken out and machined into a sputtering target in a disc shape having a diameter of 450 mm and a thickness of 5 mm. The area of the sputtering surface of the target was about 159043 $mm^2$. The oxygen concentration of the sputtering target obtained under the manufacturing condition is shown in Table 1.

In order to determine the content of impurities other than oxygen in the sputtering target obtained under the manufacturing conditions, the target elements described above were measured by GDMS method. The results are shown in Table 1.

Further, the sputtering surface of the sputtering target obtained under the manufacturing conditions was observed by SEM to determine the maximum grain size of Si grains by the method described above. The results are shown in Table 1. The discrimination of a $WSi_2$ grain and a Si grain was performed by the difference in contrast in an SEM image. Since Si grains-are made of a lighter element than $WSi_2$ grains, a portion identified as black grain with low brightness is a Si grain and a portion identified as light gray grain is a $WSi_2$ grain in an SEM image.

Further, the number of low-density semi-sintered portions having a size of 50 μm or more (bright spot) in the whole sputtering surface of a sputtering target obtained under the manufacturing conditions was visually measured. The results in terms of the number per 80000 $mm^2$ are shown in Table 1. Incidentally, detachment of SiO occurs by an exothermic reaction also during the synthesis reaction, so that a small amount of low-density semi-sintered portions is present even without performing an oxygen lowering step.

A tungsten silicide film was deposited on a silicon wafer having a diameter of 300 mm under the following sputtering conditions using the sputtering target obtained under the manufacturing conditions described above, and the number of particles having a size of 0.05 μm or more on the silicon wafer was measured. Here, the particle having a size of 0.05 μm or more refers to a particle that can be enclosed by a smallest circle with a diameter of 0.05 μm or more virtually drawn on the silicon wafer. The results are shown in Table 1.

Sputtering Condition

Sputtering apparatus: Endura sputtering system manufactured by Applied Materials, Inc.
Input: 5 kw
Substrate temperature: 300° C.
Ultimate vacuum: 1×10$^{-6}$ torr
Sputtering gas: Ar
Gas flow rate: 40 sccm
Film thickness: 50 nm Example 2

A sputtering target was manufactured in the same manner as in Example 1 except that ball milling after the tungsten silicide synthesis and ball milling of Si lumps were changed to jet milling, and characteristic evaluation and sputtering testing were performed in the same manner as in Example 1. The results are shown in Table 1.

Example 3

A sputtering target was manufactured in the same manner as in Example 2 except that the mixing conditions prior to synthesis of tungsten silicide were changed to an atomic ratio of W:Si=1:2.7 without further addition of Si powder, and characteristic evaluation and sputtering testing were performed in the same manner as in Example 1. The results are shown in Table 1.

Example 4

A sputtering target was manufactured in the same manner as in Example 3 except that the pulverization under an argon atmosphere after synthesis of tungsten silicide was changed to pulverization under a nitrogen atmosphere, and characteristic evaluation and sputtering testing were performed in the same manner as in Example 1. The results are shown in Table 1.

Comparative Example 1

A sputtering target was manufactured in the same manner as in Example 1 except that the raw material mixture powder prior to hot pressing in Example 1 was reheated under the synthesis conditions of tungsten silicide described above, pulverized with a roll crusher mill after the heat treatment, sifted with a sieve having an opening of 150 μm, and then subjected to hot pressing, and characteristic evaluation and sputtering testing were performed in the same manner as in Example 1. The results are shown in Table 1.

Comparative Example 2

A sputtering target was manufactured in the same manner as in Example 4 except that the WSi$_2$ fine powder prior to hot pressing in Example 4 was reheated under the synthesis conditions of tungsten silicide described above, pulverized with a roll crusher mill after the heat treatment, sifted with a sieve having an opening of 150 μm, and then subjected to hot pressing, and characteristic evaluation and sputtering testing were performed in the same manner as in Example 1. The results are shown in Table 1.

TABLE 1

|  | Oxygen concentration (ppm by mass) | Impurity concentration in total (ppm by mass) | Maximum grain size of Si grains (μm) | Number of low-density semi-sintered portion having size of 50 μm or more per 80000 mm$^2$ of sputtering surface | Number of grains |
|---|---|---|---|---|---|
| Example 1 | 2000 | 8 | 20 | 5 | 100 |
| Example 2 | 1500 | 5 | 8 | 2.5 | 60 |
| Example 3 | 800 | 5 | 10 | 0.5 | 30 |
| Example 4 | 500 | 7 | 12 | 0 | 10 |
| Comparative Example 1 | 400 | 8 | 20 | 7.5 | 150 |
| Comparative Example 2 | 300 | 5 | 15 | 20 | 1000 |

Discussion

As can be seen from the results in Table 1, through suppression of the number density of the low-density semi-sintered portion (bright spot), particles can be significantly reduced during sputtering even with a high oxygen concentration.

What is claimed is:

1. A tungsten silicide target comprising not more than 5 low-density semi-sintered portions having a size of 50 μm or more per 80000 mm$^2$ on a sputtering surface, the tungsten silicide target having an oxygen concentration of 500 ppm by mass to 2000 ppm by mass and having a maximum grain size of 20 μm or less of Si grains on the sputtering surface observed.

2. The tungsten silicide target according to claim 1, having a Si content in excess of a stoichiometric composition WSi$_2$.

3. The tungsten silicide target according to claim 1, having a maximum grain size of 15 μm or less of Si grains on the sputtering surface observed.

4. A method of manufacturing the tungsten silicide target according to claim 1 comprising:
   obtaining a mixture of a WSi$_2$ powder having an oxygen concentration of 500 ppm by mass to 2000 ppm by mass and a maximum grain size of 20 μm or less and a Si powder having an oxygen concentration of 500 ppm by mass to 2000 ppm by mass and a maximum grain size of 20 μm or less; and sintering the mixture under pressure to obtain a sintered product.

5. A method of manufacturing a tungsten silicide film, comprising sputtering using the tungsten silicide target according to claim 1.

* * * * *